United States Patent [19]

Zültzke et al.

[11] Patent Number: 4,868,004
[45] Date of Patent: Sep. 19, 1989

[54] METHOD FOR CREATING A CORROSION-RESISTANT, LARGELY ABSORPTION-FREE COATING ON THE SURFACE OF A WORKPIECE

[75] Inventors: Walter Zültzke; Andreas Grunewald, both of Maintal, Fed. Rep. of Germany

[73] Assignee: Leybold-Aktiengesellschaft, Hanau, Fed. Rep. of Germany

[21] Appl. No.: 151,718

[22] Filed: Feb. 3, 1988

[30] Foreign Application Priority Data

Dec. 12, 1987 [DE] Fed. Rep. of Germany ....... 3742204

[51] Int. Cl.$^4$ .............................................. B05D 3/06
[52] U.S. Cl. ...................................... 427/42; 427/49; 427/163; 427/166; 427/167; 427/294; 427/255.2; 427/255.3; 427/255.5; 427/255.7; 427/404; 427/419.3
[58] Field of Search ............... 427/163, 166, 167, 294, 427/255.5, 255.7, 255.2, 404, 419.3, 255.3, 42, 49

*Primary Examiner*—Bernard Pianalto
*Attorney, Agent, or Firm*—Felfe & Lynch

[57] ABSTRACT

In a method for creating a corrosion-resistant coating (27) of high reflectivity on the surface of a workpiece (22), especially a glass reflector insert, in an evacuable coating chamber with a vaporizing system disposed therein, a second coating (24) of aluminum is deposited cold from a vapor onto a first, cold-applied coating (23) forming an adhesion mediator of nickel-chromium oxide, and onto that a third coating (25) of $SiO_2$ is applied cold, and a fourth coating (26) of $TiO_2$ or $Ta_2O_5$ is applied at a workpiece temperature of at least 250° C., and finally, as a fifth coating (27), a nickel-chromium oxide layer is deposited reactively from a vapor at a workpiece temperature of at least 250° C. The deposit of the first, third, fourth and fifth coatings (23, 25, 26, 27) from a vapor is performed by means of electron beam vaporizers and the vapor depositing of the second coating (24) is performed by means of a resistance vaporizer.

4 Claims, 3 Drawing Sheets

METHOD FOR CREATING A CORROSION-RESISTANT, LARGELY ABSORPTION-FREE COATING ON THE SURFACE OF A WORKPIECE

The invention relates to a method for creating a corrosion-resistant, largely absorption-free coating on the surface of a workpiece, especially a glass reflector insert, in an evacuable coating chamber containing an evaporating system.

A method is known for creating a protective coating on the surface of optical reflectors, preferably reflectors vapor-coated with aluminum, in a vacuum tank (DAS 26 45 448), in which the reflectors are exposed to a monomeric vapor of organic compounds and in which the protective coating is deposited by polymerization from the vapor phase with the aid of the radiation from an electrical gas discharge, the protective coating being formed by polymerization of an organic silicon substance.

Practice, however, has shown that the production of a layer packet of a lacquer layer, an aluminum layer and a single protective coating of polymer fails to achieve the corrosion resistance especially required by the automobile industry.

It is therefore the aim of the present invention to devise a layer packet which will have an outstanding corrosion resistance combined with especially good reflectivity.

According to the invention this aim is achieved in that, at a workpiece temperature of about 250° C., a nickel-chromium oxide coating is reactively applied as a corrosion resistant layer onto a multi-layer system created on the workpiece, a nickel-chromium alloy of about 80:20 being vaporized for this purpose.

In a preferred embodiment, a second coating of aluminum is applied cold to a first, cold-applied coating forming an adhesion mediator of nickel-chromium oxide, and a third coating of silicon dioxide is applied cold and a fourth coating of $TiO_2$ or $Ta_2O_5$ is applied at a workpiece temperature of at least 250° C., and finally a fifth, corrosion-resistant coating of nickel-chromium oxide is applied reactively from a vapor at a workpiece temperature of at least 250° C. to serve as a protective coating.

Advantageously, the adhesion mediator in the form of an 80/20 nickel-chromium alloy is applied to the workpiece reactively from a vapor in a thickness of about 100 Angstroms.

It is best to apply the second coating of reflection-producing aluminum in a thickness of about 1000 Angstroms, the third coating of low refractive index in a thickness of a quarter of the selected measuring wavelength, and the fourth coating which has a high refractive index is best applied in a thickness of a quarter of the selected measuring wavelength.

Preferably, then, the fifth coating is a nickel-chromium oxide coating with a thickness between 25 and 50 Angstroms which is applied to the fourth coating of high refractive index, a nickel-chrome alloy of about 80/20 being evaporated for this purpose.

If the topmost coating of the multiple-coating system is developed with a refractive index between 2.0 and 2.4, nickel-chromium alloys can be used for the protective coating whose alloy ratios are between 75/25 and 85/15.

The invention admits of a great variety of embodiments. One of them is represented diagrammatically in the appended drawings, wherein:

DETAILED DESCRIPTION OF THE DRAWINGS

Figure 1:
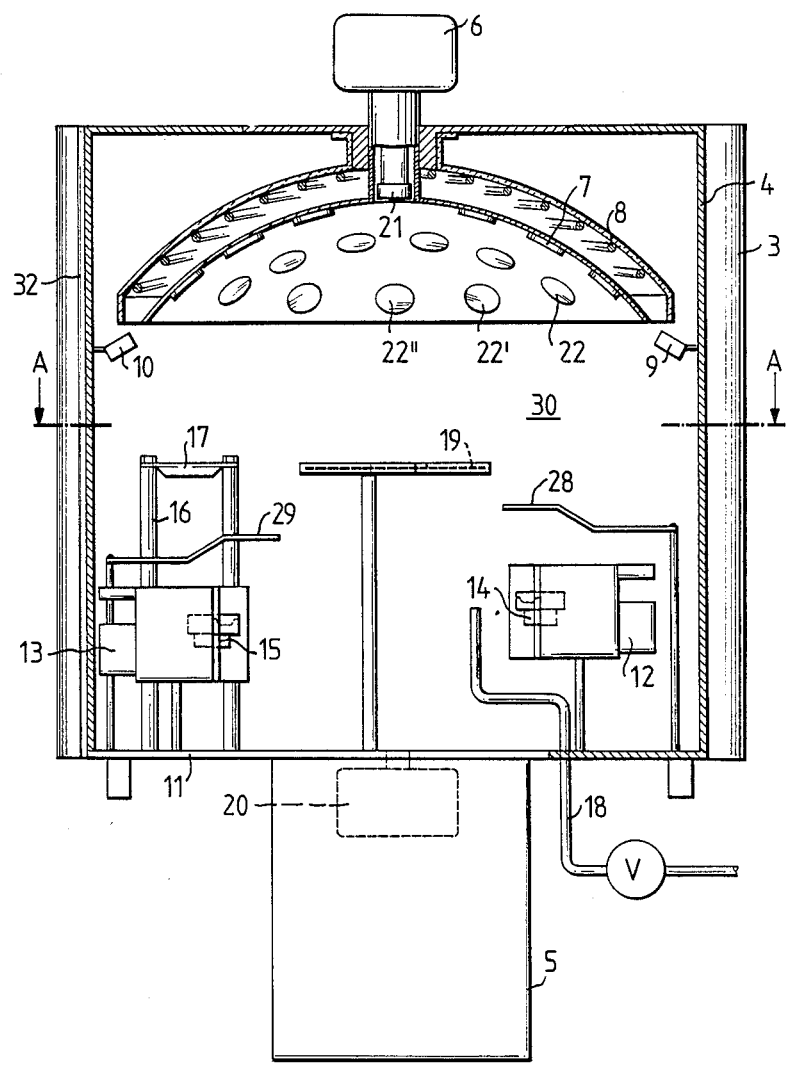
FIG. 1 is a side view of an apparatus for the practice of the method.
Figure 2:
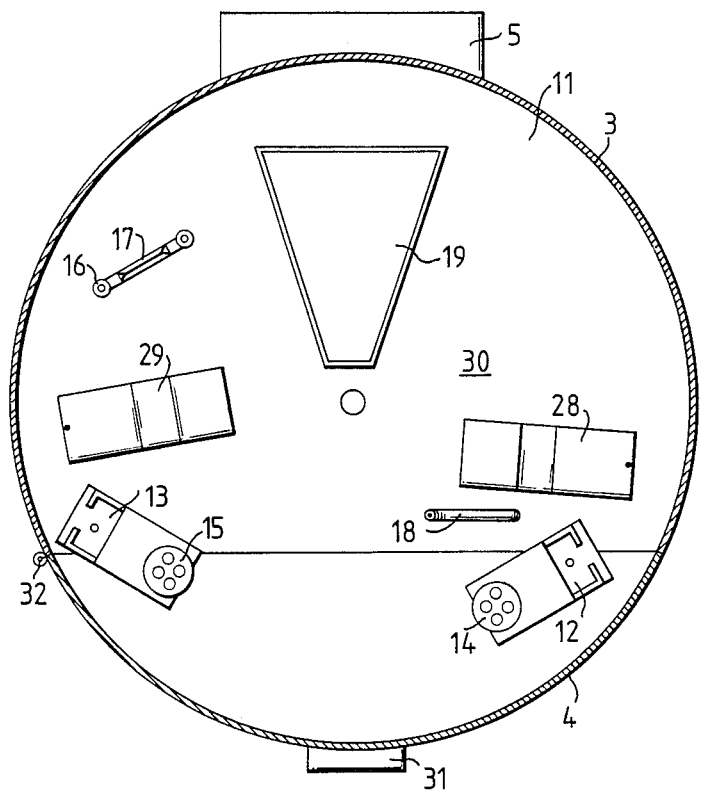
FIG. 2 is a top view of the apparatus of FIG. 1 in a section alone lines A—A.

The apparatus according to FIGS. 1 and 2 for the practice of the method consists of a hermetically sealed casing 3 having a door 4 that can be swung forward to open it, a vacuum pump stand 5 in which the vacuum pumps, not shown in detail, are situated for pumping out the interior of the casing, a turning drive 6 disposed on the top of the casing 3 for an inverted bowl-shaped substrate holder 7 mounted for rotation in the interior of the casing 3, with the workpieces disposed or suspended thereon, a substrate heater 8 fixedly disposed above the substrate holder, the vibrating quartz crystals 9 and 10 for the physical measurement of the coating thickness, two electron beam evaporators 12 and 13 fixedly mounted on the floor 11 of the casing with their melting crucibles 14 and 15, a resistance heater 16 disposed beside the electron beam evaporators 12 and 13 with pans 17, the reactive gas inlet 18 brought through the floor 11, a screen-like incandescent cathode 19, and finally the light source with detector 20 with the test glass 21 fastened in the center of the bowl-like substrate holder 7 for the optical measurement of the coating thickness.

Figure 3:
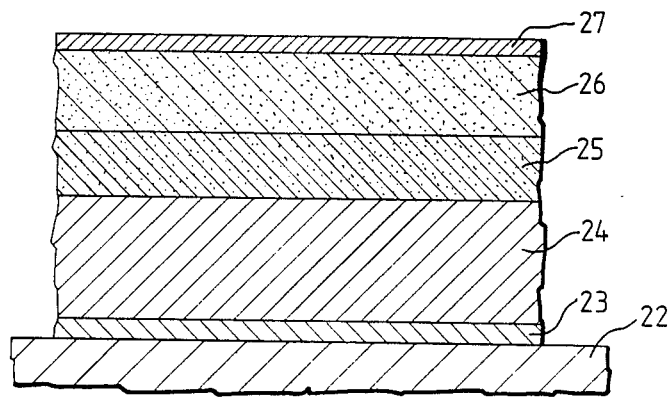
FIG. 3 is a section through the coating system of the substrate.

After the workpieces 22, 22', . . . are hung for coating in the bowl-like substrate holder 7 and the crucibles 14 and 15 and pan 17 have been filled with the materials to be evaporated, the casing 3 is closed with the door 4 and then it is pumped down until an interior pressure suitable for the coating process is reached. Then the coatings 23 to 27 represented in FIG. 3 are applied, coatings 23, 25, 26 and 27 being applied by means of the electron beam evaporators 12 and 13 and coating 24 by means of the resistance evaporator 16. Above the two electron beam evaporators 12 and 13 are baffles 28 and 29 which prevent premature coating of the workpieces 22, 22', . . . during the melting process and, by controlled release of the evaporators, permit a precise coating thickness. In order to free the substrates or workpieces 22, 22', . . . of impurities, especially precipitated moisture, the incandescent cathode 19 can also be heated. Evaporation of aluminum for the application of coating 25 is made possible by the resistance evaporator 16 whose crucible or pan 17 is filled with pure aluminum. For the production of the two coatings 26 and 27 it is desirable to activate the substrate heater 8 by means of which the workpieces can be heated to at least 250° C. before applying the coatings 26 and 27. While the coating operation is in progress in the coating chamber 30, the growth of the coatings 23 to 27 can be monitored, both optically by means of the light source with detector 20 and the test glass 21, and with the aid of the vibrating quartz crystals 9 and 10. The tube 18 leads into the evacuable coating chamber 30 and through it reactive gas can be introduced for a reactive process. Such a process is necessary for the formation of the oxides of coatings 23, 26 and 27.

It is clear that the described apparatus and the method according to the invention are available not just for the coating of reflector inserts but also for the coating of optical glasses and filters, cold light mirrors, line filters etc.

Figure 4:
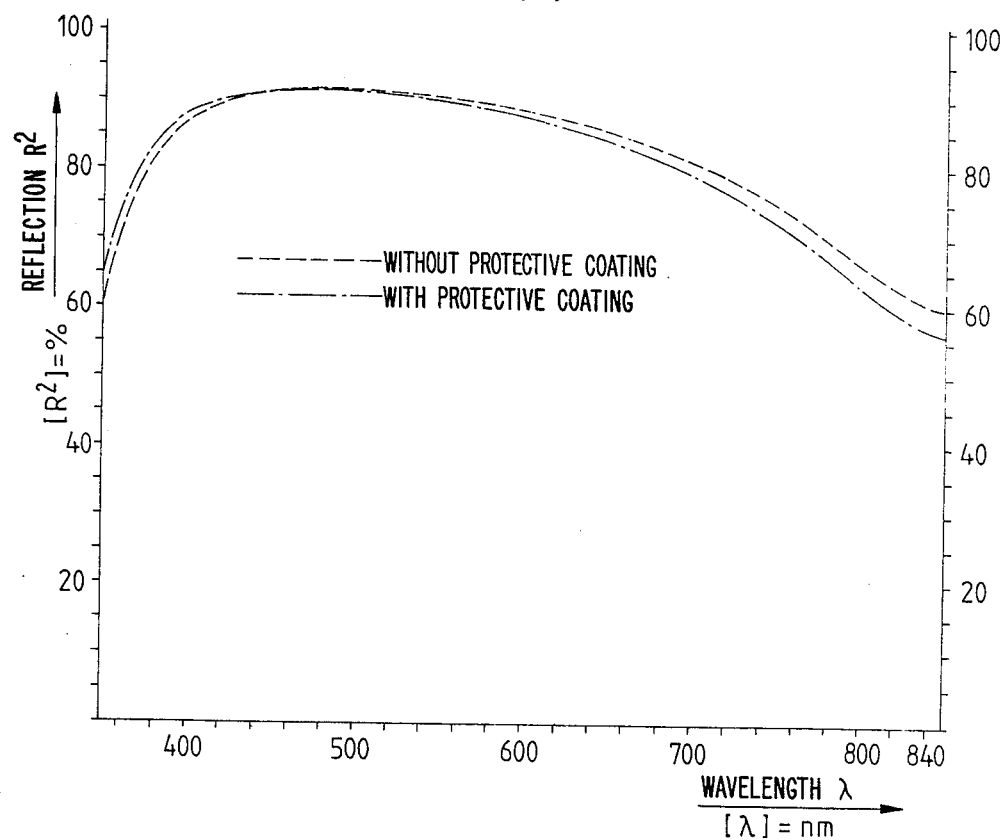
FIG. 4 is a diagrammatic representation of the reflectivity of the mirror coating provided with a protective coating.

The described protective coating, which resembles a high coating in refractive index (e.g., coating 26), can be selected such that the spectral reflectivity of a mirror is reduced but negligibly (max. 0.5 percentage point reflection loss over the entire visible spectrum). The example of a protective coating illustrated in FIG. 4 was deposited from a vapor of 80/20 chromium-nickel alloy, namely with an electron beam evaporator under an oxygen partial pressure of about $2 \times 10^{-4}$ mbar at a substrate temperature of 250° C. If no higher temperatures are to be attributed to the workpieces, the oxidation process can be performed also at lower temperature at sufficient rates.

We claim:

1. A method for producing a corrosion-resistant, largely absorption-free coating on the surface of a substrate workpiece in an evacuable coating chamber having vaporizing means disposed therein, comprising depositing an adhesion mediator first layer comprising an 80/20 NiCr alloy onto said substrate to a thickness of about 100 Angstroms; applying from a vapor a second, reflection producing coating of aluminum to a thickness of abut 1000 Angstroms onto said first layer; applying a third coating of $SiO_2$ having a low refractive index at a thickness of $\lambda/4$; applying a fourth coating selected from the group consisting of $TiO_2$ or $T_2O_5$ having a high refractive index at a temperature of at least 250° C. to a thickness of $\lambda/4$; and applying a fifth coating reactively from a vapor at a temperature of at least 250° C., said layer being applied as a 80/20 NiCr oxide coating to a thickness between 25 to 50 Angstroms onto said fourth coating of high refractive index, said NiCr alloy being evaporated for this purpose.

2. The method defined in claim 1 wherein said fourth layer has a refractive index between about 2.0 and 2.4 and said NiCr alloys comprising said fifth coating contain ratios between about 75/25 and about 85/15.

3. The method defined in claim I wherein said vaporizing means for depositing said first, third, fourth and fifth coatings in an electron beam vaporizer.

4. The method defined in claim 1 wherein said vapor depositing of said second coating is performed by a resistance vaporizer.

* * * * *